United States Patent [19]

Reele et al.

[11] Patent Number: 5,400,219
[45] Date of Patent: Mar. 21, 1995

[54] TAPE AUTOMATED BONDING FOR ELECTRICALLY CONNECTING SEMICONDUCTOR CHIPS TO SUBSTRATES

[75] Inventors: Samuel Reele; Thomas R. Pian, both of Rochester, N.Y.

[73] Assignee: Eastman Kodak Company, Rochester, N.Y.

[21] Appl. No.: 218,876

[22] Filed: Mar. 28, 1994

Related U.S. Application Data

[63] Continuation of Ser. No. 939,343, Sep. 2, 1992, abandoned.

[51] Int. Cl.$^6$ .............................................. H05K 7/02
[52] U.S. Cl. .................................... 361/760; 361/748; 361/749; 361/772; 361/776; 361/810; 361/813; 257/666; 174/52.1; 174/259; 174/261; 228/180.21
[58] Field of Search .............. 361/707, 744, 748, 749, 361/760, 761–767, 772, 776, 813, 810; 174/255, 259, 260, 261, 52.1; 257/666, 692, 690, 786; 228/180.2

[56] References Cited

U.S. PATENT DOCUMENTS

| | | | |
|---|---|---|---|
| 4,575,747 | 3/1986 | Fritz | 357/70 |
| 4,655,551 | 4/1987 | Washizuka et al. | 350/334 |
| 4,733,292 | 3/1988 | Jarvia | 357/70 |
| 4,744,007 | 5/1988 | Watari et al. | 361/386 |
| 4,760,335 | 7/1988 | Lindberg | 324/158 F |
| 4,899,174 | 2/1990 | Newman et al. | 346/107 R |
| 4,899,185 | 2/1990 | Newman | 346/155 |
| 4,980,034 | 12/1990 | Volfson et al. | 204/38.4 |
| 4,999,700 | 3/1991 | Dunaway et al. | 357/70 |
| 5,023,751 | 6/1991 | Stampfli | 361/398 |
| 5,036,431 | 7/1991 | Adachi et al. | 361/412 |
| 5,126,920 | 6/1992 | Cardashian et al. | 361/398 |
| 5,150,280 | 9/1992 | Arai et al. | 361/401 |

FOREIGN PATENT DOCUMENTS 2124433 2/1984 United Kingdom .

OTHER PUBLICATIONS

IBM, Laser Microwelding of Tape Automated Bonding Components, Nov., 1988, IBM Technical Disclosure Bulletin vol. 31, No. 6, 385–389.

"TAB Technology Tackles High Density Interconnections" from Electronic Packaging and Production, vol. 24, No. 12, Dec., 1984; by Tom Dixon, pp. 34–39.

*Primary Examiner*—Leo P. Picard
*Assistant Examiner*—Young Whang
*Attorney, Agent, or Firm*—Norman Rushefsky

[57] ABSTRACT

An article of manufacture which has a substrate including electrical leads and bond pads electrically connected to the leads. Two or more integrated circuit semiconductor chips are supported on the substrate. Each of the chips includes a plurality of edges and a plurality of input/output (I/O) bond pads. A portion of the bond pads on each chip are located adjacent at least one edge of the respective chip. At least two separate sections of Tape Automated Bonding (TAB) tape electrically connect the I/O bond pads on each chip to the bond pads on the substrate. In a refinement of the invention, the sections of TAB tape each include a plurality of inner lead bond leads extending from a longitudinal (along the tape length) edge of the tape. Each inner lead bond is connectable to one of the I/O bond pads on the chips. The inner lead bond leads are located a uniform distance apart from each other, this distance equalling the smallest distance apart between adjacent bond pads on any chip which the TAB tape is compatible with.

8 Claims, 4 Drawing Sheets

TAPE AUTOMATED BONDING FOR ELECTRICALLY CONNECTING SEMICONDUCTOR CHIPS TO SUBSTRATES

This is a continuation of application Ser. No. 07/939,343, filed Sep. 2, 1992, now abandoned.

TECHNICAL FIELD OF THE INVENTION

The present invention relates generally to Tape Automated Bonding (TAB) and, more specifically, to the use of TAB tape to electrically connect integrated circuit semiconductor chips to a substrate.

BACKGROUND ART

In the formation of electronic devices it is necessary to electrically couple input/output (I/O) bond pads on each integrated circuit semiconductor chip to electrical leads on a substrate to which the chip is mounted. One method of attaching the I/O pads is wire bonding. In this process one end of a wire, typically of 1 mil diameter, is bonded to an I/O pad while the other end of the wire is bonded to the appropriate lead on the substrate. With wire bonding specific chip applications do not require new custom tooling. Soft tooling (software changes) enable users to apply wire bonding to each particular chip. This is true whether the chips are packaged in through hole mounted packages, surface mounted packages, or whether the chips are directly attached through wires to the substrate.

Another method of coupling the I/O pads with the substrate leads is TAB. In contrast with wire bonding, the use of TAB tape to attach the I/O pads of semiconductor chips to leads on a substrate has centered around the concept of requiring a custom TAB tape design for each chip application. This is required in order to match the TAB tape inner lead bonding to the size, bond pad pitch and bond pad pattern of the chip. The result is that TAB has been limited to high volume applications due to the excessive tooling costs ($100–200K) and long lead times (three months) for custom TAB tape designs.

SUMMARY OF THE INVENTION

The present invention relates to an article of manufacture which has a substrate including electrical leads and bond pads electrically connected to the leads. An integrated circuit semiconductor chip is supported on the substrate. The chip includes a plurality of edges and a plurality of input/output (I/O) bond pads located adjacent at least one of the edges. At least two separate sections of Tape Automated Bonding (TAB) tape electrically connect the I/O bond pads on the chip to the bond pads on the substrate.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The following disclosure enables the use of a series of standard TAB tape designs for all custom applications. Soft tooling changes allow these standard designs to be used for all custom applications.

Figure 1:
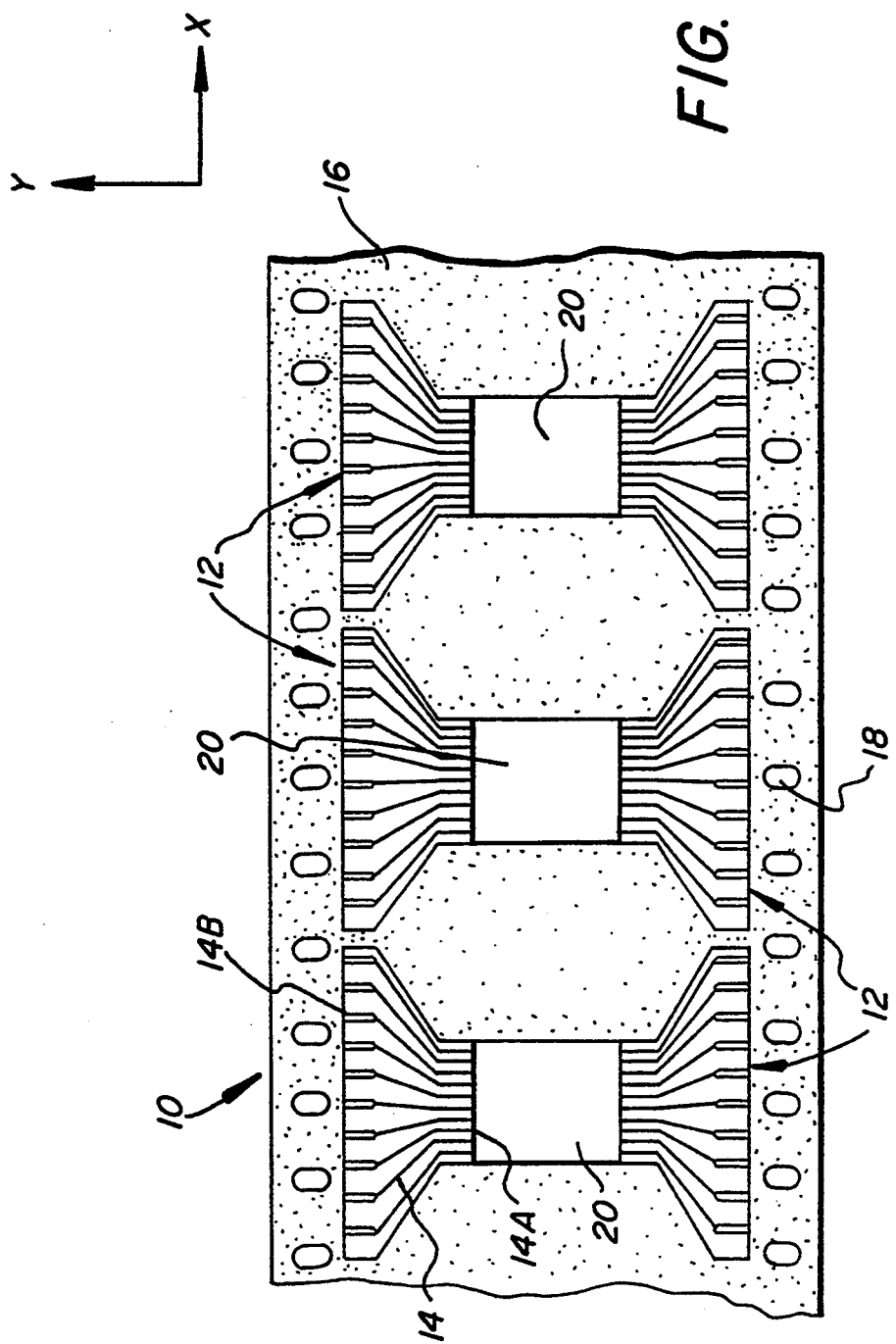
FIG. 1 is a schematic representation of a TAB tape of the present invention.

Referring to FIG. 1, a TAB tape designated generally by the reference numeral 10 is shown. TAB Tape 10 includes a series of interconnection patterns 12 which are repeated along both longitudinal edges of the TAB tape. Each interconnection pattern includes a plurality of electrically conductive leads 14 which are used instead of wire to connect a semiconductor chip's I/O bond pads to bond pads on a substrate to which the chip is mounted. Each lead 14 includes an inner lead portion 14A for bonding with an I/O bond pad of the semiconductor chip and an outer lead portion 14B for bonding with a bond pad on the substrate. The inner lead portions are located a uniform distance apart from each other. Interconnection patterns 12 are formed on a support 16 which is preferably made of a polyimide. Support 16 can alternatively be made of a Kapton material. Drive sprockets 18, such as those found in photographic film, and apertures 20 are punched or etched into support 16. The apertures are located between the series of interconnection patterns 12 with each aperture being located between two opposing interconnection pattern. The sprockets allow automation of the tape automation bonding process.

One method of forming TAB tape 10 is as follows. A tape made of an electrically conductive material such as copper, typically of 1-oz. thickness (about 1.4 mils), is coated on one side with a liquid polyimide which is then dried and cured. The polyimide layer has a thickness of between about 2 to 3 mils and acts as a support. The copper side of the resulting structure is then imaged and developed. Pattern 12 is then formed in the copper layer by one of the standard copper etching processes such as cupric chloride or ferric chloride. The copper side of the structure is then coated with polyimide and cured. Apertures 20 and sprockets 18 are made in the support via a punching/stamping process.

TAB tape 10 of the present invention is designed to connect the I/O bond pads of more than one type of semiconductor chip to a substrate. This is accomplished by several features of the TAB tape. The width (X direction) of each aperture 20 is selected to match the widest width chip which the TAB tape is compatible with, such as chip 22 in FIG. 2. The Length (Y direction) of aperture 20 is selected to match the length of the most commonly used chip that the TAB tape is compatible with such as chip 24 in FIG. 2.

In addition, the distance between adjacent leads of inner lead portions 14A on this tape is selected to match the distance between the highest density I/O bond pads for the chips with which the tape is compatible. In other words, the distance between adjacent leads is equal to the smallest distance apart between adjacent I/O bond pads on any of a series of different semiconductor chips with which the TAB tape is compatible. This allows one TAB tape to be used with several types of chips, each chip having a spacing between adjacent bond pads which is an integer multiple of the distance between the inner leads of the TAB tape. For example, a TAB tape whose inner lead portion leads are all spaced apart from each other a distance of 50 microns can be used to bond a chip's I/O bond pads (shown as dots adjacent the periphery of each chip) whose distance from one another is an integer multiple of 50 microns (e.g. 50, 100, 150 etc. microns). In the case where the I/O pads are spaced 100 microns apart, only every other inner lead portion lead will contact an I/O pad. In the case where the I/O pads are spaced 150 microns apart, only every third inner lead portion lead will contact an I/O pad. Therefore, extra inner lead portion leads are present for chips whose I/O bond pad pitch does not match the pitch of the inner lead portions on the TAB tape. These initially unused inner lead portion leads can be utilized for redundancy, rework or repair. A plurality of inner lead portion leads can be bonded to a larger I/O bond pad to accommodate, for example, a higher electrical current requirement. To cover all chip designs, a finite number of different TAB tapes are used, for example, having inner lead portion leads spaced 60, 70, 80 and 90 microns apart.

In the case of bumped TAB tape, non used inner lead portion leads are processed (similar to rework) to remove the bumps on these inner lead portions. For bumped chips nothing need to be done to the TAB tape. For transfer bumped TAB tape, the bumps need to be transferred only to the active inner lead portion leads of the TAB tape. As used herein, the term "bond pad" on a chip or substrate includes those that feature bumps.

Figure 2:
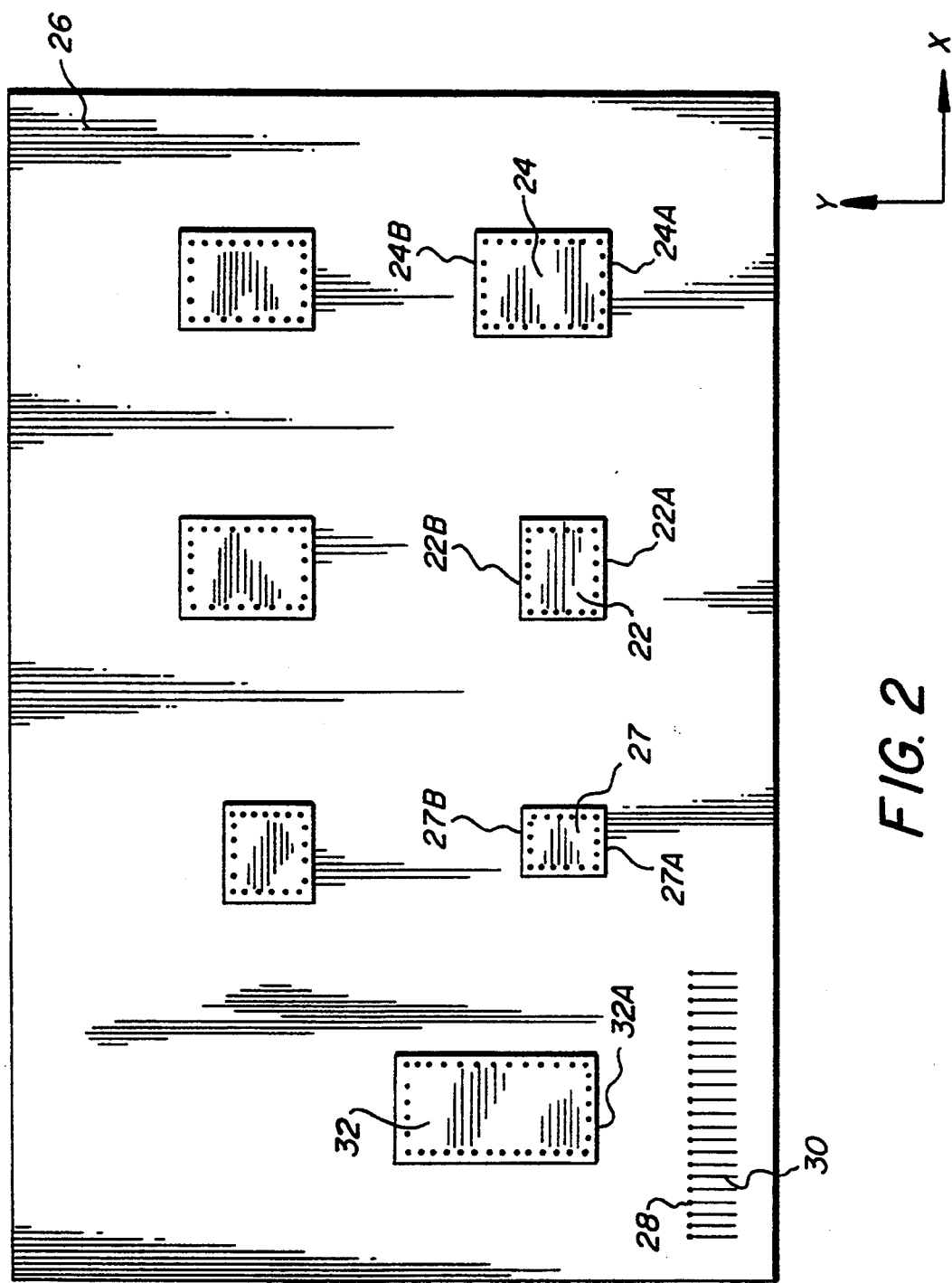
FIG. 2 is a schematic top view representation of a substrate with a plurality of integrated circuit semiconductor chips mounted to the substrate.

Turning now to FIG. 2, a circuit board substrate 26 is shown with a plurality of semiconductor chips, including chips 22, 24, 27 and 32 mounted on and supported by the substrate. Each chip has a plurality of edges and a plurality of I/O bond pads (shown as dots) located adjacent at least one of the edges. Although the I/O bond pads are shown as a linear array, the present invention is compatible with bond pads located in an area array on the chip. The substrate also includes substrate bond pads 28 and substrate electrical leads 30 electrically connected to bond pads 28. The substrate bond pads and leads are only shown adjacent one edge 32A of chip 32 but it is understood that there are similar substrate bond pads and leads adjacent all edges of all chips which have I/O bond pads that need to be connected to the substrate. The leads 30 will be appropriately routed to, for example, connect the chip to each other or to other bond pads for connection with components, for example, on other circuit boards.

Figure 3:
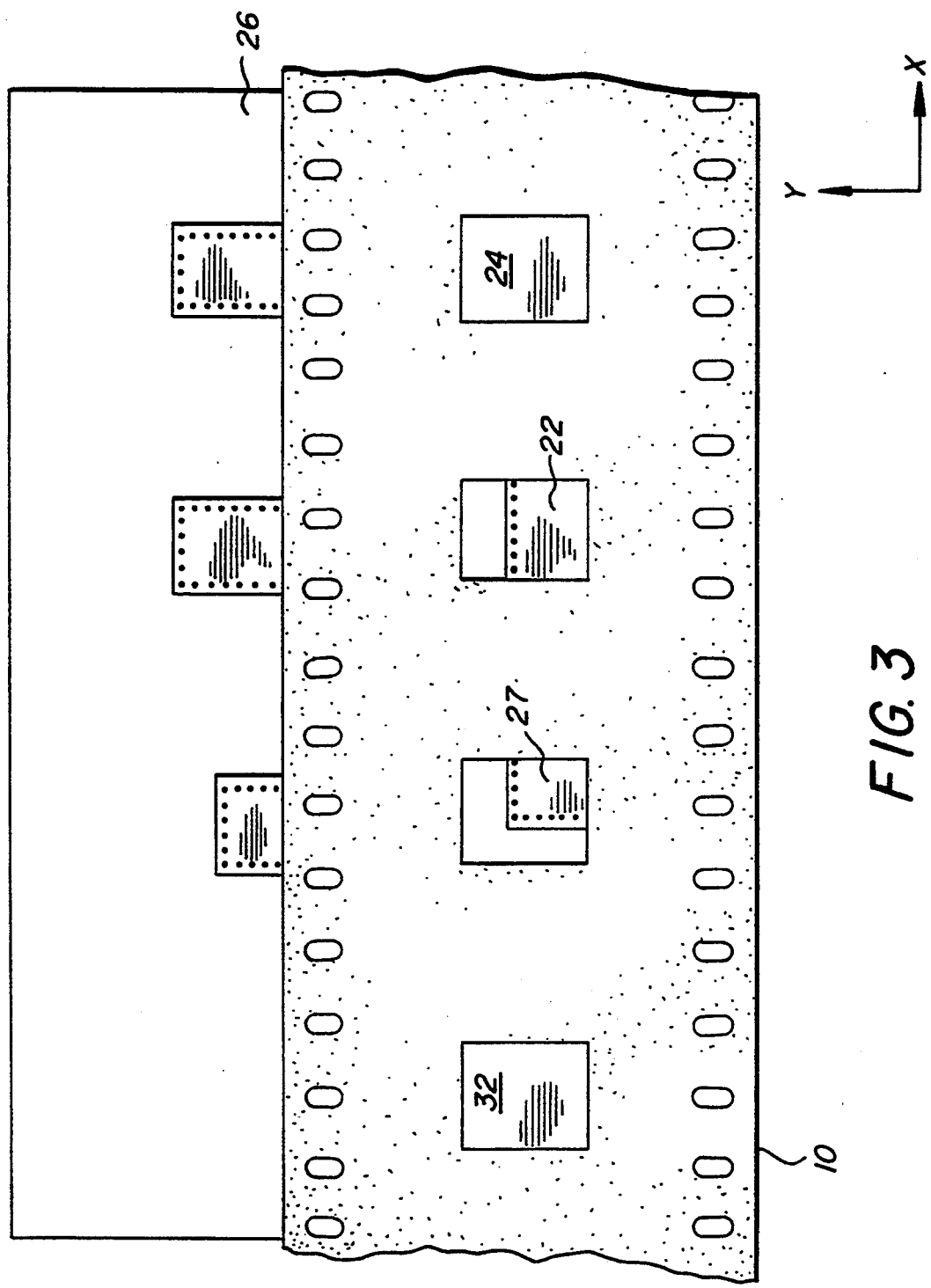
FIG. 3 is a view of the TAB tape of FIG. 1 flipped over and aligned with collinear edges of a portion of the chips on the substrate.
Figure 4:
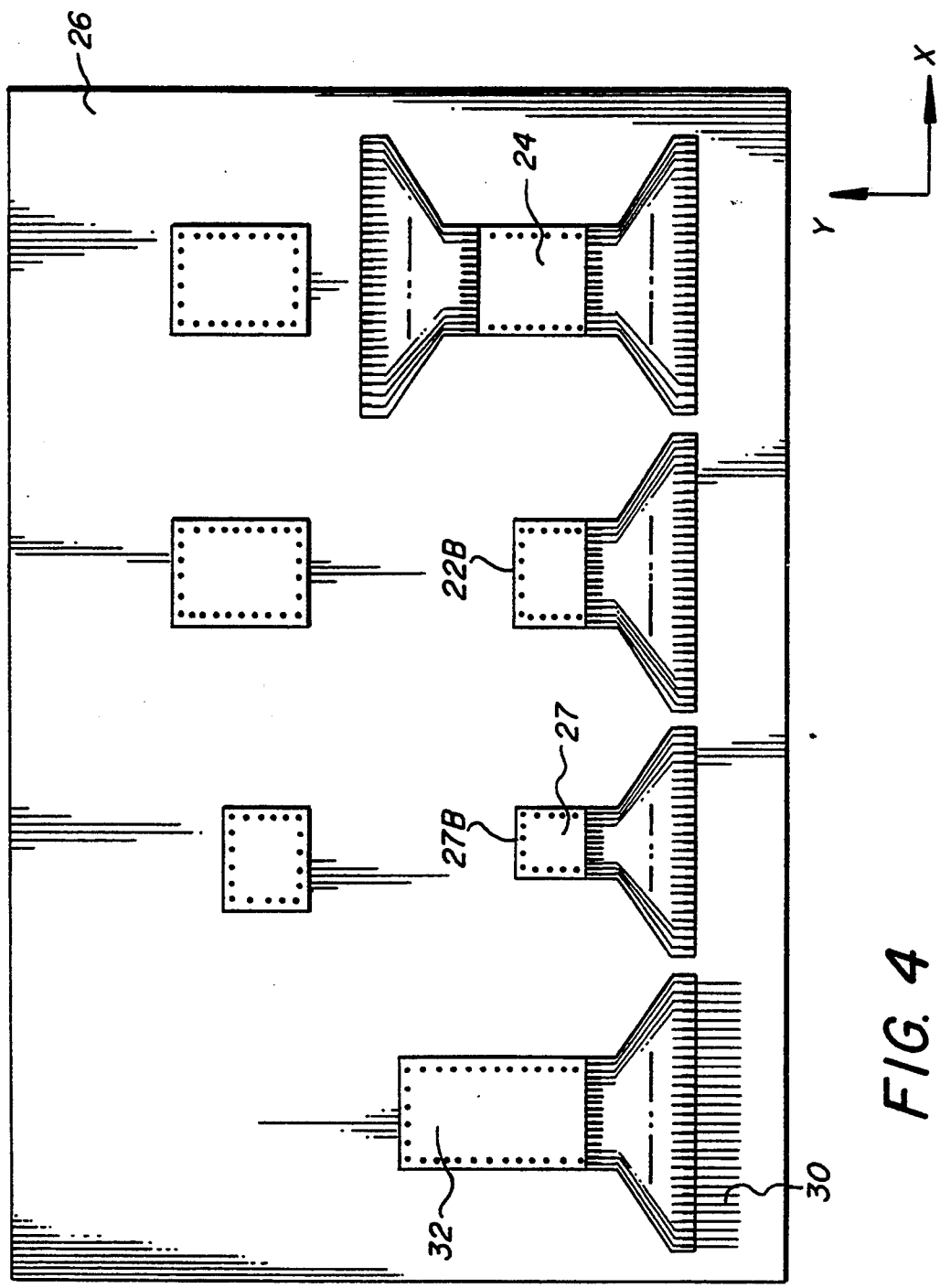
FIG. 4 is a view of the substrate of FIG. 2 with certain I/O bond pads bonded to the substrate using portions of the TAB tape of FIG. 3 after other portions thereof have been trimmed away.

FIG. 3 displays the TAB tape of FIG. 1 flipped over and mounted on substrate 26. Certain inner lead portions 14A of TAB tape 10 are aligned with edges 22A, 24A, 27A, 32A and 24B, which edges are collinear and/or parallel with each other, of chips 22, 24, 27 and 32, and are bonded to the I/O bond pads located adjacent these edges by, for example, thermal compression bonding. The outer lead portions of the TAB tape associated with these edges are bonded to the substrate bond pads by either thermal compression bonding or solder reflow junction. Next, those portions of TAB tape 10 not associated with the bonding of edges 22A, 24A, 27A, 32A and 24B are severed by a laser cutting step and removed. FIG. 4 displays the resulting bonding of the I/O bond pads adjacent 22A, 24A, 27A, 32A, and 24B to their respective substrate bond pads (only shown at 30). It may be seen that the outer lead bond pads formed on the substrate are spaced a greater distance apart then the respective inner lead bond pads. The leads on the tape are suitably fanned out to accommodate the spacing of the bond pads.

A new, separate section of TAB tape would then be used to bond the I/O bond pads adjacent sides 27B and 22B of chips 27 and 22. Each time the process is repeated, all the I/O bond pads which are at a certain X latitude and which are compatible with the TAB tape presently being used will be gang bonded. Several different TAB tapes with various aperture sizes and lead pitches may be needed to bond all the chips to the substrate. After all the I/O bond pads located adjacent chip sides parallel to the X axis are bonded, the process is repeated for those I/O bond pads adjacent chip sides which are parallel to the Y axis. At least two separate sections of TAB tape are used to electrically connect the I/O bond pads on the chip to the substrate bond pads. The intersections of the X and Y TAB tapes can be secured together by an adhesive tack weld, mechanical fastener or reflow solder of two securing pads, one located on each tape, which are aligned with each other. In this manner, all the I/O bond pads will be bonded to the substrate bond pads. If there is a chip which is not compatible with a standardized TAB tape as disclosed above, a custom TAB tape can be used for this chip.

It is assumed that device designers will optimize the maximum number of chips whose edges are collinear along an X or Y axis by using "standard cell" TAB tapes chosen from a CAE library of standard available TAB tapes in a manner similar to standard cell integrated circuit layout methodologies.

There has been shown a generic TAB tape which can be used to bond more than one type of semiconductor chip to a substrate. This eliminates the need for custom TAB tape designs resulting in decreased tooling costs and shorter lead times when bonding with this TAB tape. In addition, edges of chips which are collinear can be gang bonded, resulting in decreased time required to bond chips to substrates.

The present invention can also be used for chip-on-tape applications in which the chip is bonded to the TAB tape(s) prior to being mounted on the substrate. This allows testing and burn-in of the chip prior to mounting on the substrate.

The invention has been described in detail with particular reference to preferred embodiments thereof, but it will be understood that variations and modifications can be effected within the spirit and scope of the invention.

What is claimed is:

1. A method of forming an assembly of plural semiconductor chips to a substrate, comprising the steps of:
    (a) providing a substrate which includes electrical leads and bond pads electrically connected to said leads and plural semiconductor chips mounted to said substrate, each chip including a plurality of edges and a plurality of input/output (I/O) bond pads located adjacent at least one of said edges; and
    (b) bonding a group of I/O bond pads located adjacent plural of said edges, which edges are essentially colinear with each other, on respective plural chips, to a first group of substrate bond pads with a first section of TAB tape
    (c) severing portions of the TAB tape which include interconnection patterns not associated with said I/O bond pads bonded in said bonding step (b); and (d) removing portions severed in step (c) to leave portions of said tape bonded to said bond pads located adjacent the colinear edges; and wherein said edges of said chips that are generally colinear are directed in a first direction and wherein at least some of said chips include I/O bond pads located adjacent a second plurality of edges of chips, which edges are generally colinear with each other on respective plural chips and directed in a second direction perpendicular to the first direction and including the step of (e), subsequent to step (d), bonding a group of I/O bond pads located adjacent said second plurality of edges to a second group of substrate bond pads with a second section of TAB tape; and, (f) severing portions of the second section of TAB tape; and (g) removing portions severed in step (f) to leave portions of said second section of TAB tape bonded to bond pads located adjacent said second plurality of edges of chips.

2. The method of claim 1 and including the step of securing an intersection of first and second sections of TAB tape.

3. The method of claim 1 wherein one of said I/O bond pads is bonded with plural inner lead portions on said first section of TAB tape.

4. The method of claim 1 and wherein the first section of TAB tape bonds two chips each with linear uniformly spaced bond pads wherein bond pads of one of two chips are spaced at a different spacing than bond pads of the other of the two chips and wherein the TAB tape section includes two interconnection patterns and inner lead portions in each interconnection pattern are located the same uniform distance apart.

5. The method of claim 4 and wherein one of said I/O bond pads is bonded with plural inner lead portions.

6. A method of forming an assembly of plural semiconductor chips to a substrate, comprising the steps of:
 (a) providing a substrate which includes electrical leads and bond pads electrically connected to said leads and plural semiconductor chips mounted to said substrate, each chip including a plurality of edges and a plurality of input/output (I/O) bond pads located adjacent at least one of said edges; and
 (b) bonding a group of I/O bond pads located adjacent plural of said edges, which edges are essentially colinear with each other, on respective plural chips, to a first group of substrate bond pads with a section of TAB tape, the section of TAB tape including an elongated support having a longitudinal edge and a series of identical interconnection patterns which are repeated proximate the longitudinal edge, each interconnection pattern including a plurality of electrically conductive leads extending transversely to said direction, said leads each including an inner lead portion and an outer lead portion, the outer lead portions all being closer to said longitudinal edge, said inner lead portions of a respective pattern ending adjacent an edge formed in said support;
 (c) severing portions of the TAB tape which include interconnection patterns not associated with said I/O bond pads bonded in said bonding step (b); and
 (d) removing portions severed in step (c) to leave portions of said tape bonded to said bond pads located adjacent the colinear edges.

7. A method of forming an assembly of plural semiconductor chips to a substrate, comprising the steps of:
 (a) providing a substrate which includes electrical leads and bond pads electrically connected to said leads and plural semiconductor chips mounted to said substrate, each chip including a plurality of edges and a plurality of input/output (I/O) bond pads located adjacent at least one of said edges; and
 (b) bonding a group of I/O bond pads located adjacent plural of said edges, which edges are essentially colinear with each other, on respective plural chips, to a first group of substrate bond pads with a section of TAB tape, wherein the section of TAB tape bonds two chips each with linear uniformly spaced bond pads wherein bond pads of one of two chips are spaced at a different spacing than bond pads of the other of the two chips and wherein the TAB tape section includes two interconnection patterns and the inner lead portions in each interconnection pattern are located the same uniform distance apart;
 (c) severing portions of the TAB tape which include areas not associated with said I/O bond pads bonded in said bonding step (b); and (d) removing portions severed in step (c) to leave portions of said tape bonded to said bond pads located adjacent the colinear edges.

8. The method of claim 7 and wherein one of said I/O bond pads is bonded with plural inner lead portions.

* * * * *